United States Patent [19]

Hamashima et al.

[11] Patent Number: 4,769,551
[45] Date of Patent: Sep. 6, 1988

[54] PATTERN DETECTING APPARATUS UTILIZING ENERGY BEAM

[75] Inventors: Muneki Hamashima; Kinya Kato, both of Tokyo; Tatsumi Ishizeki, Ohmiya; Kou Sekiba, Tokyo; Hiroaki Iseya, Fujisawa, all of Japan

[73] Assignee: Nippon Kogaku K.K., Tokyo, Japan

[21] Appl. No.: 66,241

[22] Filed: Jun. 25, 1987

[30] Foreign Application Priority Data

Jun. 27, 1986 [JP] Japan ................................ 61-151112
Dec. 18, 1986 [JP] Japan ................................ 61-302419
Jan. 22, 1987 [JP] Japan ................................. 62-13109

[51] Int. Cl.$^4$ ........................................ G01N 21/86
[52] U.S. Cl. ...................................... 250/548; 356/401
[58] Field of Search ...................... 250/548, 557, 571; 356/400, 401

[56] References Cited

U.S. PATENT DOCUMENTS

| | | | |
|---|---|---|---|
| 4,566,795 | 1/1986 | Matsuura et al. | 356/400 |
| 4,577,095 | 3/1986 | Watanabe | 250/201 |
| 4,701,050 | 10/1987 | Oshida et al. | 250/557 |
| 4,702,606 | 10/1987 | Matsuura et al. | 356/400 |
| 4,725,737 | 2/1988 | Nakata et al. | 250/548 |

Primary Examiner—David C. Nelms
Assistant Examiner—Stephone B. Allen
Attorney, Agent, or Firm—Shapiro and Shapiro

[57] ABSTRACT

Pattern detection and measurement comprises: first irradiation means for irradiating a workpiece with a first energy beam; detection means for receiving a second energy beam emitted from a portion of the workpiece irradiated by the first energy beam, thereby detecting a pattern in the irradiated portion; second irradiation means for irradiating the workpiece with a third energy beam; discrimination means for receiving a fourth energy beam emitted from a portion of the workpiece irradiated by the third energy beam, thereby discriminating whether the portion irradiated by the third energy beam is sensitive to the first energy beam; and control means for controlling, in response to the output of the discrimination means, the first energy beam in irradiating the sensitive portion, thereby preventing the damage of the sensitive portion by the first energy beam.

12 Claims, 14 Drawing Sheets

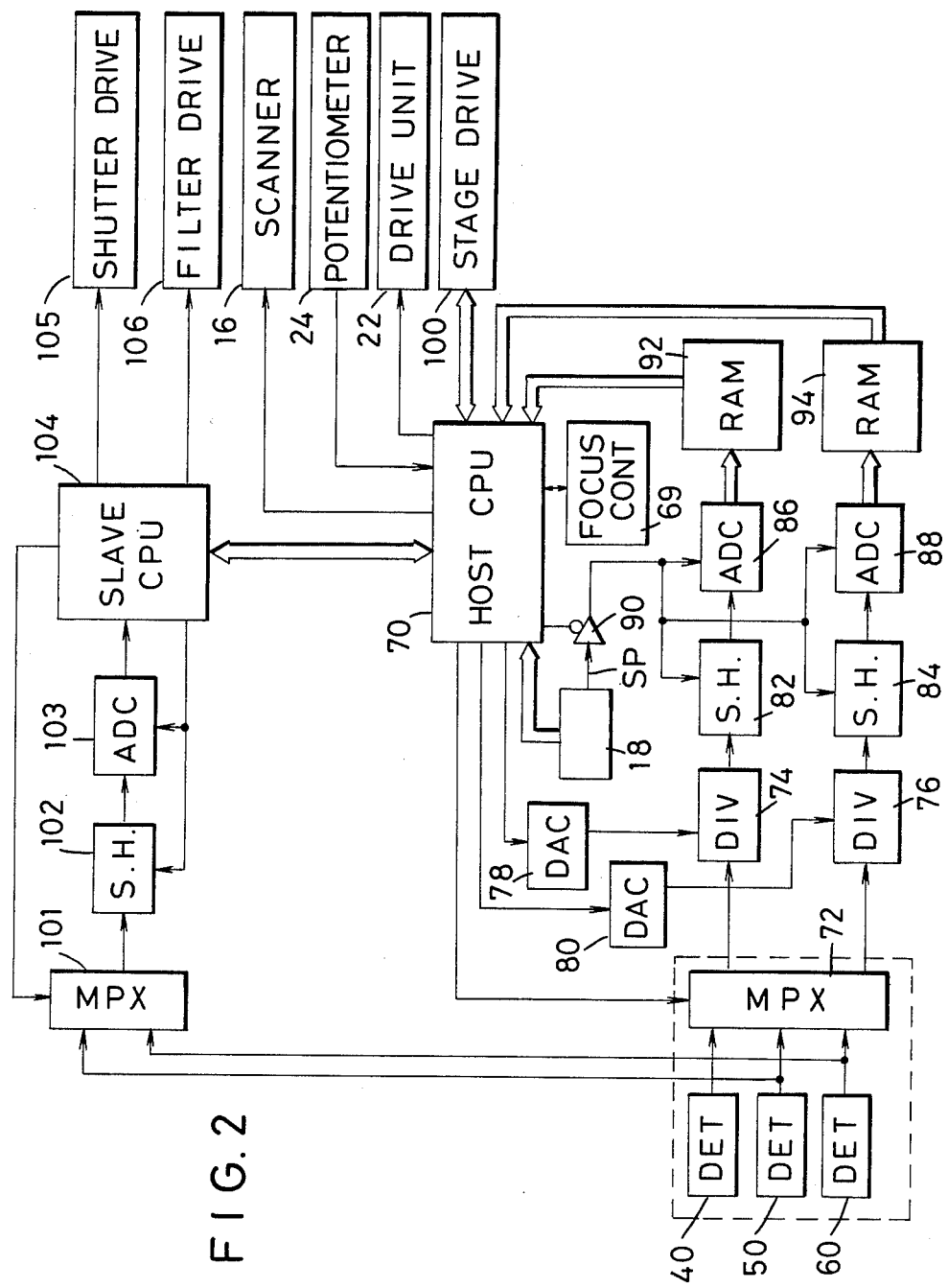
F I G. 2

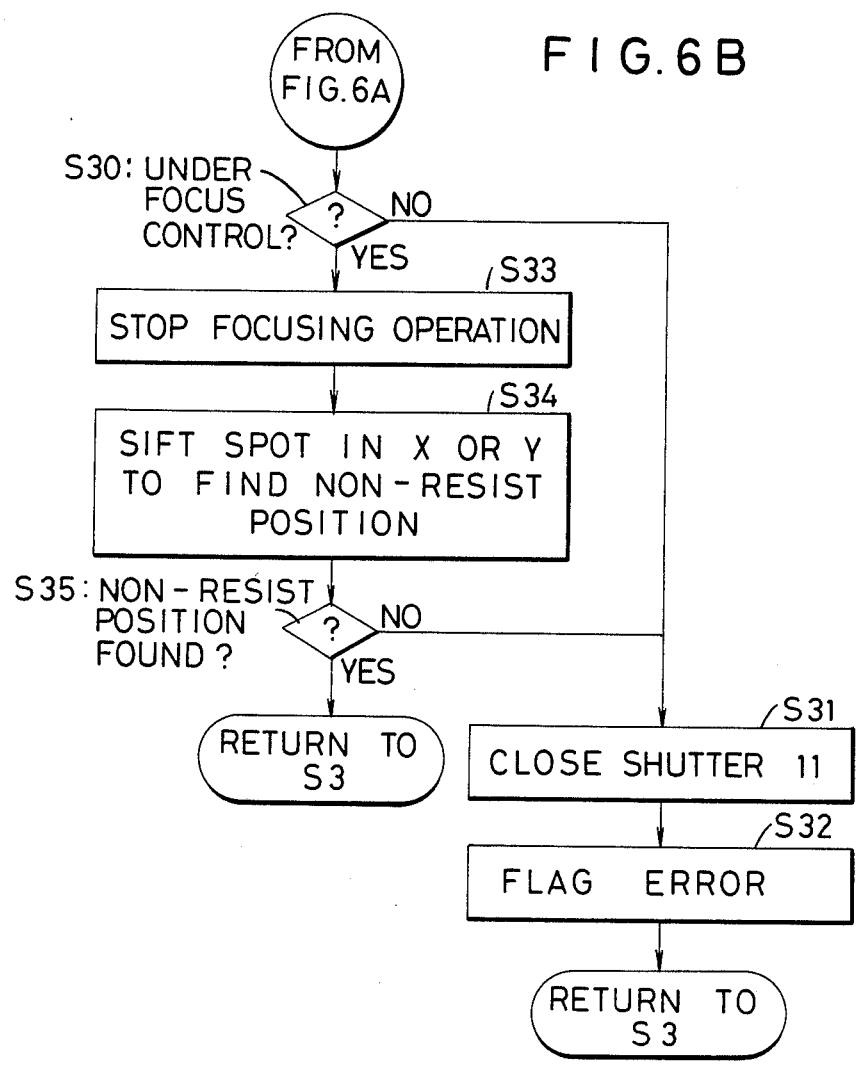

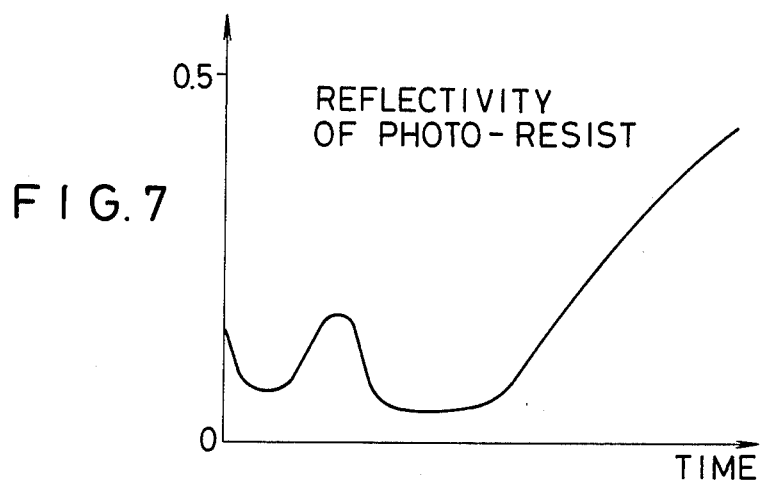
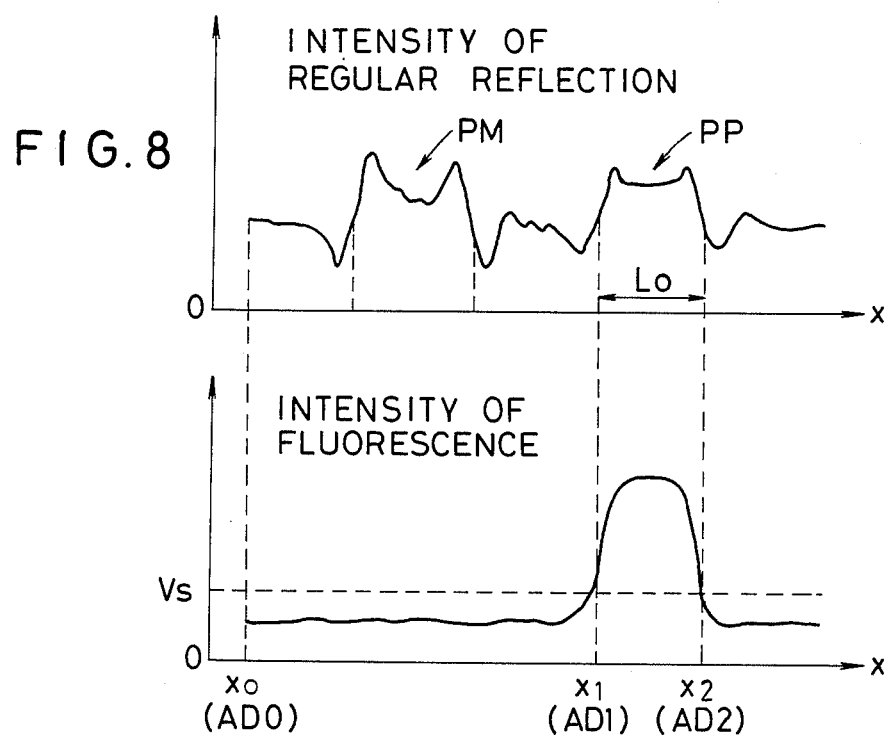

FIG.11
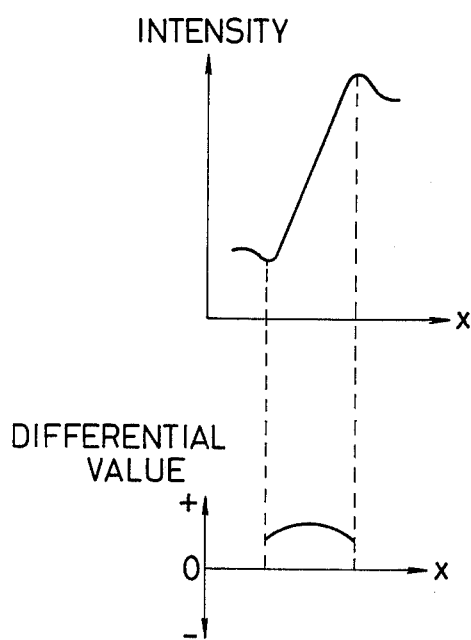
FIG.12 UNDER GRANULATION
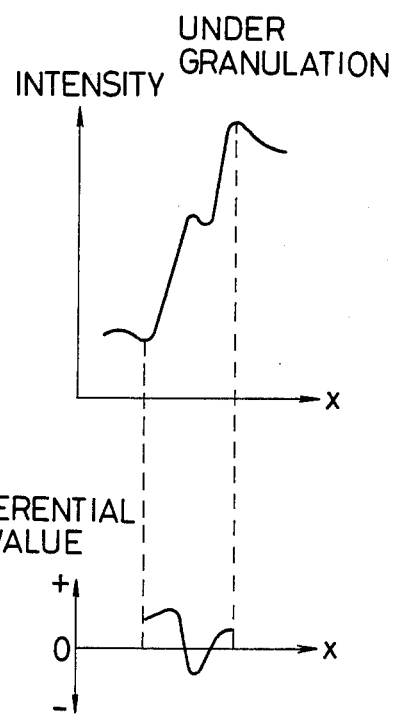
FIG.13
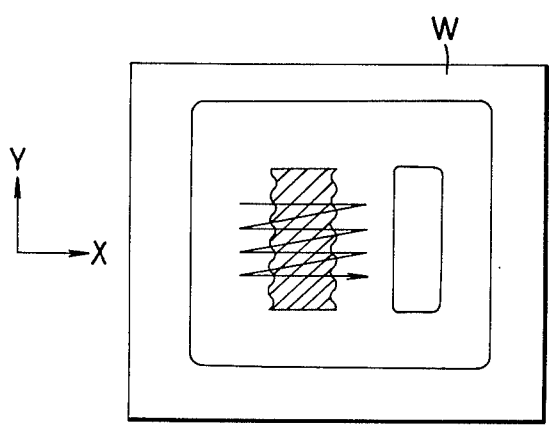

PATTERN DETECTING APPARATUS UTILIZING ENERGY BEAM

BACKGROUND OF THE INVENTION

1. Field of the Invention

The present invention relates to an apparatus for detecting the position of particulate materials on a workpiece, and more particularly to a pattern position detecting apparatus utilizing an energy beam, adapted for identifying the edge position or the width of a photoresist pattern employed in the manufacturing process of semiconductor devices.

2. Related Background Art

Semiconductor wafers employed for the manufacture of semiconductor devices such as IC's and LSI's are subjected to various treatments in the course of manufacturing process. For achieving desired performance it is important to accurately control the width or dimension of the circuit pattern or alignment mark pattern in the manufacturing process, and for this purpose there is required an apparatus for detecting the pattern with a high precision.

In the U.S. patent application Ser. No. 06/808,932 filed Dec. 13, 1985 and assigned to the assignee of the present application, is disclosed an apparatus for scanning the wafer with a probing laser beam and detecting the reflected light, scattered light and fluorescent generated when a pattern edge is scanned with said laser beam, thereby detecting the position of said edge.

In such apparatus, however, the measurement of a photoresist pattern may result in a damage (destruction or deterioration) of said photoresist as the result of exposure thereof to said laser beam for measurement. The possibility of said damage has been increased by the measures adopted for improving the precision of detection of such apparatus. More specifically, for improving the precision of detection, there have been employed to shorten the wavelength of laser beam through the use of HeCd laser or Ar laser, and to reduce the probing beam diameter by concentrating the beam with an optical system. The former method may bring the wavelength of the laser beam within the photosensitive wavelength range of the photoresist, while the latter method enhances the deterioration of photoresist due to the increased density of the laser beam irradiating the photoresist, thereby increasing the possibility of damage.

SUMMARY OF THE INVENTION

The object of the present invention is to provide an apparatus capable of pattern detection and measurement with a high precision, without causing damage (deterioration or destruction) in the energy sensitive material constituting the pattern.

The above-mentioned object can be achieved, according to the present invention, by an apparatus comprising:

first irradiation means for irradiating a workpiece with a first energy beam;

detection means for receiving a second energy beam emitted from a portion of said workpiece irradiated by said first energy beam, thereby detecting a pattern in said irradiated portion;

second irradiation means for irradiating said workpiece with a third energy beam;

discrimination means for receiving a fourth energy beam emitted from a portion of said workpiece irradiated by said third energy beam, thereby discriminating whether the portion irradiated by said third energy beam is sensitive to said first energy beam; and control means for controlling, in response to the output of said discrimination means, said first energy beam in irradiating said sensitive portion, thereby preventing the damage of said sensitive portion by said first energy beam.

Such structure allows to automatically discriminate a pattern form of an energy sensitive material and a non-sensitive pattern, and to irradiate such sensitive pattern with an energy beam in such a manner as not to cause damage therein.

In a preferred embodiment of the present invention, a laser beam is employed as said first energy beam, but there may also be employed other energy beams such as an electron beam or an ion beam.

Also in the present invention, the pattern-constituting energy sensitive material is not limited to a photoresist but also includes a magnetooptical substance or a nitride film, or a heat sensitive substance.

In a preferred embodiment of the present invention, a laser beam emitted from a same light source is used as the first energy beam for measurement and the third energy beam for discriminating the energy sensitive material. However, said first energy beam and said third energy beam may be different beams. For example it is possible to employ an electron beam as the first energy beam and a laser beam as the third energy beam, and to prevent the damage in the energy sensitive material by reducing the intensity of the electron beam according to the result of discrimination.

Also in a preferred embodiment of the present invention, there are provided a scanning unit for scanning said workpiece in reciprocating manner with said first energy beam, and light limiting members positioned in the light path of said energy beam in such a manner that the workpiece is not irradiated by said energy beam in the reversing portions of the reciprocating scanning, whereby the irradiation with the energy beam, giving unnecessary damage to the workpiece, can be prevented.

Also in a preferred embodiment of the present invention, the scanning speed of the first energy beam is controlled in response to the pattern detecting operation, so that the pattern detection is conducted during a constant speed scanning of the first energy beam. In this manner it is rendered possible to prevent the vibration of the entire apparatus during the acceleration or deceleration of the beam.

BRIEF DESCRIPTION OF THE DRAWINGS

FIG. 2 is a block diagram of electric circuits of said embodiment;

FIGS. 6A and 6B are flow charts showing an operation for preventing the damage in photoresist;

FIG. 7 is a chart showing time-dependent change in reflectance of photoresist;

FIG. 8 is a wave form chart showing detection signals of reflected light and fluorescent light;

FIGS. 11 and 12 are charts showing examples of error discrimination;

FIG. 13 is a schematic view showing scanning lines on a wafer;

DESCRIPTION OF THE PREFERRED EMBODIMENTS

Figure 1:
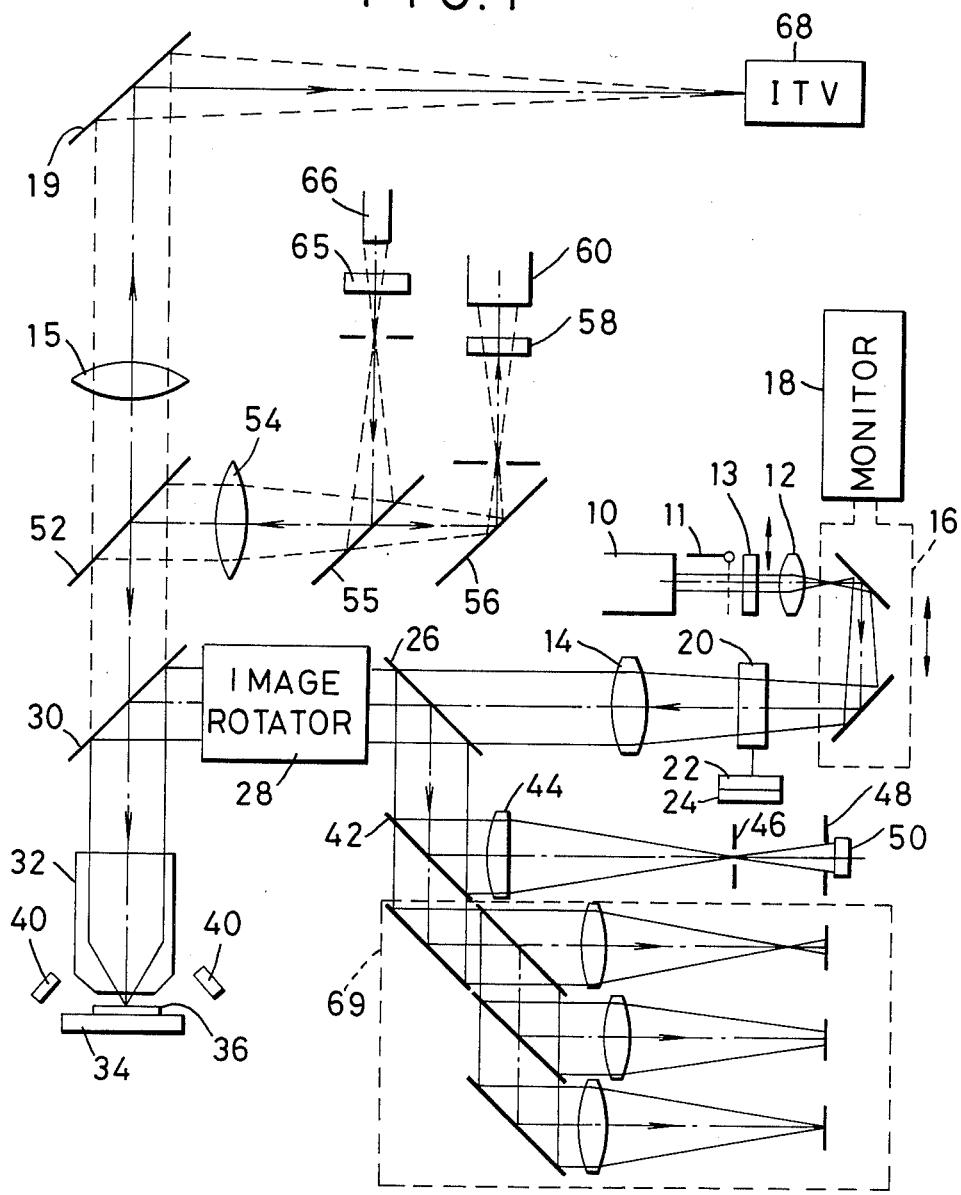
FIG. 1 is a schematic diagram of optical systems of an apparatus constituting a first embodiment of the present invention.

FIG. 1 shows the optical arrangement of a first embodiment of the present invention, wherein a laser beam source 10 emits a laser beam (coherent light) of a short wavelength, which is transmitted by a shutter 11 only when it is open. The diameter of said laser beam is expanded by lenses 12, 14 constituting a beam expander. Adjacent to the shutter 11 there is provided a variable attenuating filter 13. Between the lenses 12, 14 there is provided a scanner 16 for causing one-dimensional scanning motion of the laser beam. The scanner 16 is provided with a pair of mirrors reciprocated as indicated by arrows to cause parallel movement of the optical axis of the laser beam, without varying the optical path length thereof. A monitor 18 composed of a laser interferometer, a linear encoder etc. measures the amount of movement of said scanning unit 16.

Between said lenses 12 and 14 there is provided a flat glass plate 20 with parallel surfaces, which is used for shifting the scanning position of the laser beam and is rotated angularly with respect to the incident laser beam, by means of a driving unit comprising a stepping motor or a DC motor. The amount of angular change, or the amount of shift, of the laser beam, is detected by a potentiometer 24.

After passing said lens 14, the laser beam is transmitted by a beam splitter 26 and an image rotating prism 28, then reflected by a dichroic mirror 30 and enters an objective lens 32. Said dichroic mirror 30 has such spectral characteristic as to reflect the laser beam but to transmit the light of a longer wavelength. The laser beam is concentrated by the objective lens 32 and is focused as a tiny light spot on a wafer 36 placed on a stage 34. Said laser beam spot scans said wafer 36 one-dimensionally as the result of the movement of the scanning unit 16, and the scanning position is also shifted by the rotation of the glass plate 20 with parallel surfaces. Thus the wafer 36 can be two-dimensionally scanned by the laser beam spot, through the combination of the scanning unit 16 and said flat glass plate 20.

The wafer has small steps or pattern edges thereon. When the laser beam spot crosses one of such pattern edges, there results scattered light (or diffracted light from the step). A major portion of said scattered light does not return to the objective lens 32, as it positioned outside a steric angle determined by the numerical aperture (N.A) of the objective lens 32. Thus such scattered light is received by an annular photoelectric detector 40 positioned around the objective lens 32.

When the wafer is illuminated by the laser beam, the regular reflected light from the wafer is transmitted by the objective lens 32, dichroic mirror 30 and image rotating prism 28, then perpendicularly reflected by the beam splitter 26 and another beam splitter 42, and is received by a lens 44, thus being focused at the center of the aperture of a diaphragm 46, which functions to intercept stray light other than the reflected light. After passing the diaphragm 46, the reflected light is detected by a detector 50, such as a silicon photodiode, through a diaphragm 48. Said photodetector 50 releases a signal corresponding to the intensity of the reflected light. Said diaphragm 48 is placed at a position conjugate with the pupil of the objective lens 32, whereby the detector 50 only detects the 0-th order component of the reflected light. Said pupil of the lens 32 is at the center of oscillation of the laser beam caused by the scanning unit 16.

A photoresist pattern, formed on the wafer, generates luminescence when excited by the laser beam of a short wavelength. Said luminescence is fluorescent light or phosphorescent light, particularly the former in the visible wavelength region of 500 to 700 nm, normally with a peak around 600 nm. Since the wavelength of such fluorescent light is longer than that of the laser beam, the fluorescent light generated by the pattern is transmitted by the objective lens 32 and the dichroic mirror 30, then is guided through a beam splitter 52, a lens 54, a dichroic mirror 55, a mirror 56 and a filter 58 for intercepting the light of the wavelength region of the laser beam, and enters a photoelectric detector 60 such as a photomultiplier.

The dichroic mirror 55 is provided for separating the fluorescent light from the wafer, from the illuminating light for observation. Thus the visible illuminating light from an illuminating system 66 is reflected by the dichroic mirror, passes through the lens 54, reflected by the beam splitter 52, passes through the dichroic mirror 30 and enters the objective lens 32, thus illuminating an observation area of the wafer. In this state, the light from the illuminating system 66 is prevented, by the dichroic mirror 55, from entering the photodetector 60.

The visible light returning from the wafer is guided, through the objective lens 32, dichroic mirror 30, lens 15 and mirror 19, to an image pickup unit 68 such as an industrial television camera, for displaying the image of the observation area on an unrepresented cathode ray tube.

The reflected light passing through the beam splitter 42 enters an automatic focusing unit 69, which detects the focus state of the laser beam, spot on the wafer and axially displaces the objective lens 32 or the stage 34 to an in-focus state. Such unit will not be explained in detail as it is already disclosed for example in the U.S. Pat. No. 4,577,095.

An explained in the foregoing, the present embodiment is so constructed as to detect various patterns formed on the wafer, through three different optical information consisting of the scattered light from the pattern edge, reflected light from the pattern edge, and luminescent light from the pattern, respectively obtained by the photodetectors 40, 50 and 60. These three optical information and the positional information on the laser beam spot enable varied measurements, such as edge detection, pattern position detection, line width, dimension etc. of various patterns such as of photoresist or polysilicon. As the light source for detecting the fluorescent light, there can be employed a HeCd laser with a wavelength of 325 nm or 442 nm, or an Ar laser with a wavelength of 488 nm. In response to such laser beam, fluorescence is exhibited not only by photoresists but also by various substances employed in the wafer process, such as nitrides (SiN, $Si_3N_4$), phosphor glass (PSG) or polyimides. In the present embodiment there will be considered the measurements of photoresist patterns.

In the following there will be explained the signal processing circuit for use in the above-explained embodiment. An example of such circuit is shown in FIG. 2, in which same components as those in FIG. 1 are represented by same numbers.

Referring to FIG. 2, the function of the entire apparatus and the signal processing therein are controlled by a host CPU 70, composed of a microcomputer or a minicomputer. The signals from three photodetectors 40, 50, 60 are entered into an analog multiplexer (MPX) 72 which arbitrarily selects two of said three signals in response to an instruction from the CPU 70. Thus selected two signals are respectively supplied, as numerators, to dividers 74, 76 which also receive, as denominators, output signals of digital-analog converters 78, 80 for converting digital instructions from the CPU 70 into analog values. In this manner the two photoelectric signals are subjected to a gain control, and are brought to an optical level for processing.

The photoelectric signals from the dividers 74, 76 are respectively supplied to sample-hold circuits 82, 84 and then to analog-digital converters 86, 88. The sampling operation of said sample-hold circuits 82, 84 and the converting operation of said A/D converters 86, 88 are conducted in response to time-sequential pulses SP each generated by the scan monitor 18 at every unit scanning amount. In this manner the intensity of the photoelectric signal is sampled and converted into a digital value at every unit movement (for example 0.01 μm) of the laser beam spot on the wafer. Said pulse signal SP is supplied to the sample-hold circuits 82, 84 and the A/D converters 86, 88 through a gate 90 controlled by an instruction from the host CPU 70. The digital values from the A/D converters 86, 88 are sequentially stored respectively in random access memories (RAM) 92, 94, of which addresses are renewed in response to each pulse signal SP. Thus the RAM's 92, 94 store wave forms of the photoelectric signals according to the scanning positions, as disclosed in the U.S. Pat. No. 4,639,604.

The data thus stored in the RAM's 92, 94 are utilized in the CPU 70 for various processes for pattern position detection or edge detection. The process utilized for such detection will not be explained in detail as it is already disclosed, for example, in the above-mentioned U.S. Patent. The CPU 70 is also connected to the scanning unit 16, the driving unit 22 for the flat glass plate 20 and the potentiometer 24, thereby controlling said scanning unit 16 and driving unit 22, and detecting the amount of shift of the laser beam through the potentiometer 24.

A stage drive unit 100 is provided with a stage driving device and an encoder for releasing signals corresponding to the amount of movement of the stage and the direction of said movement. The output of said encoder is supplied to the CPU 70, which, in response, controls the function of the stage drive unit 100.

The automatic focusing unit 69 is activated by a signal from the CPU 70, terminates the function upon completion of focusing and sends a completion signal to the CPU 70.

A multiplexer 101, a sample-hold circuit 102, an A/D converter 103, a slave CPU 104, a shutter drive unit 105 and a filter drive unit 106 discriminate whether the area illuminated by the laser beam is composed of photoresist, and control a laser shutter 11 or a variable attenuating filter 13 in order to prevent damage to the photoresist, if said area is composed of photoresist. In the following this function will be explained in more detail.

The multiplexer 101 receives the output signals of the reflected light detector 50 and the fluorescent light detector 60, and sends either signal to the sample-hold circuit 102 in response to a selection signal from the slave CPU 104. The sampling operation of the sample-hold circuit 102 and the converting operation of the A/D converter 103 are conducted in synchronization with time-sequential pulses from the CPU 104.

The slave CPU 104 discriminates whether the area presently illuminated by the laser beam is composed of photoresist, from the output signal of the A/D converter 103, corresponding to the output of the reflected light detector 50 or the fluorescent light detector 60. As explained in the foregoing, a photoresist area can be identified from the output of the fluorescent light detector 60.

Also a photoresist area can be identified by the detection of the reflected light, due to following reason. A photosensitive material such as photoresist, absorbing light and generating fluorescent light, generally shows a low reflectance. Thus, in case several patterns are present on a same wafer, an area showing lowest output from the reflected light detector 50 can be identified as photoresist.

Also when the laser beam spot is positioned on photoresist, the reflectance exhibits a time-dependent change since the refractive index of photoresist varies due to the time-dependent chemical change. Consequently the output signal of the reflected light detector 50 varies in time, as shown in FIG. 7. Thus a photoresist area can be identified according to whether the reflectance varies in time.

In this manner a photoresist area can be identified from a low reflectance and/or a time-dependent change in reflectance.

Once it is determined that the illuminated area is composed of photoresist, a drive signal is supplied to the shutter drive unit 105 thereby closing the shutter 11 to intercept the laser beam, or to the filter drive unit 106 to reduce the transmittance of the variable attenuating filter 13, thus decreasing the intensity of the laser beam. Said variable attenuating filter 13 can be composed of plural ND filters suitably inserted into or retracted from the laser beam.

Figure 3:
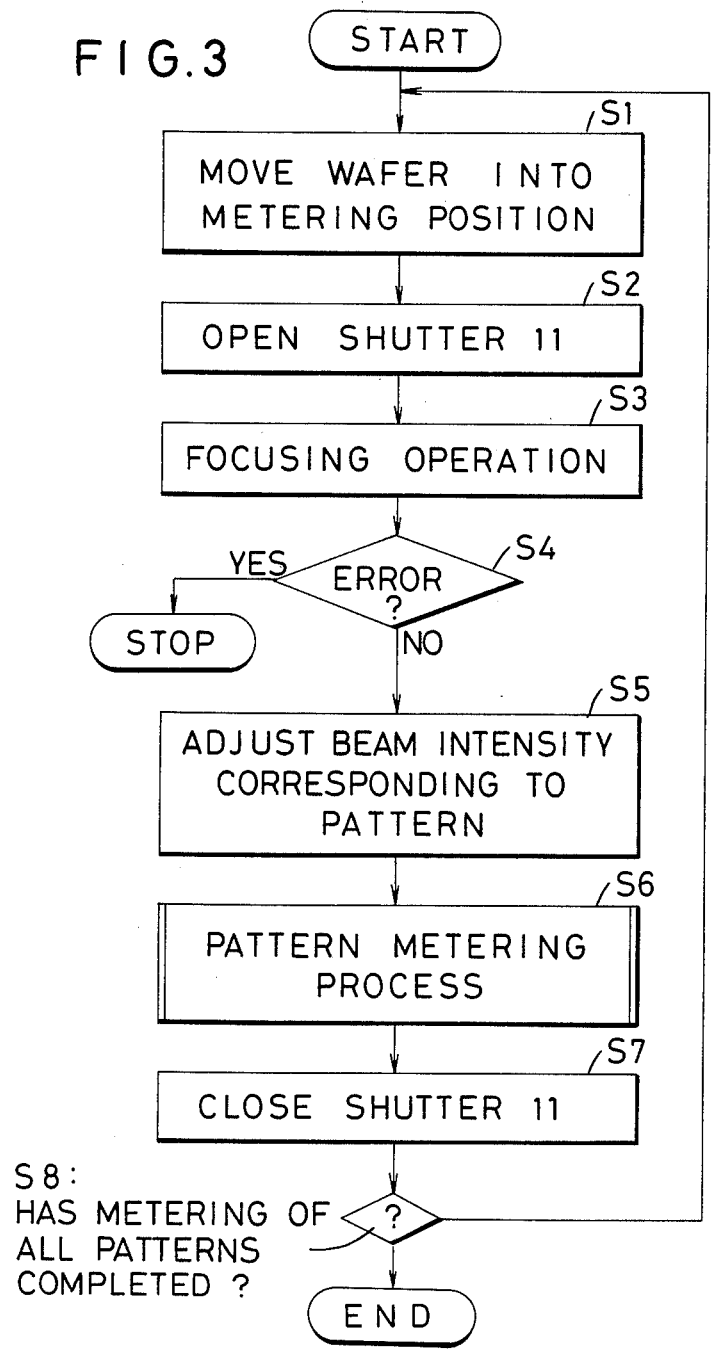
FIG. 3 is a flow chart showing the function of said embodiment.
Figure 4:
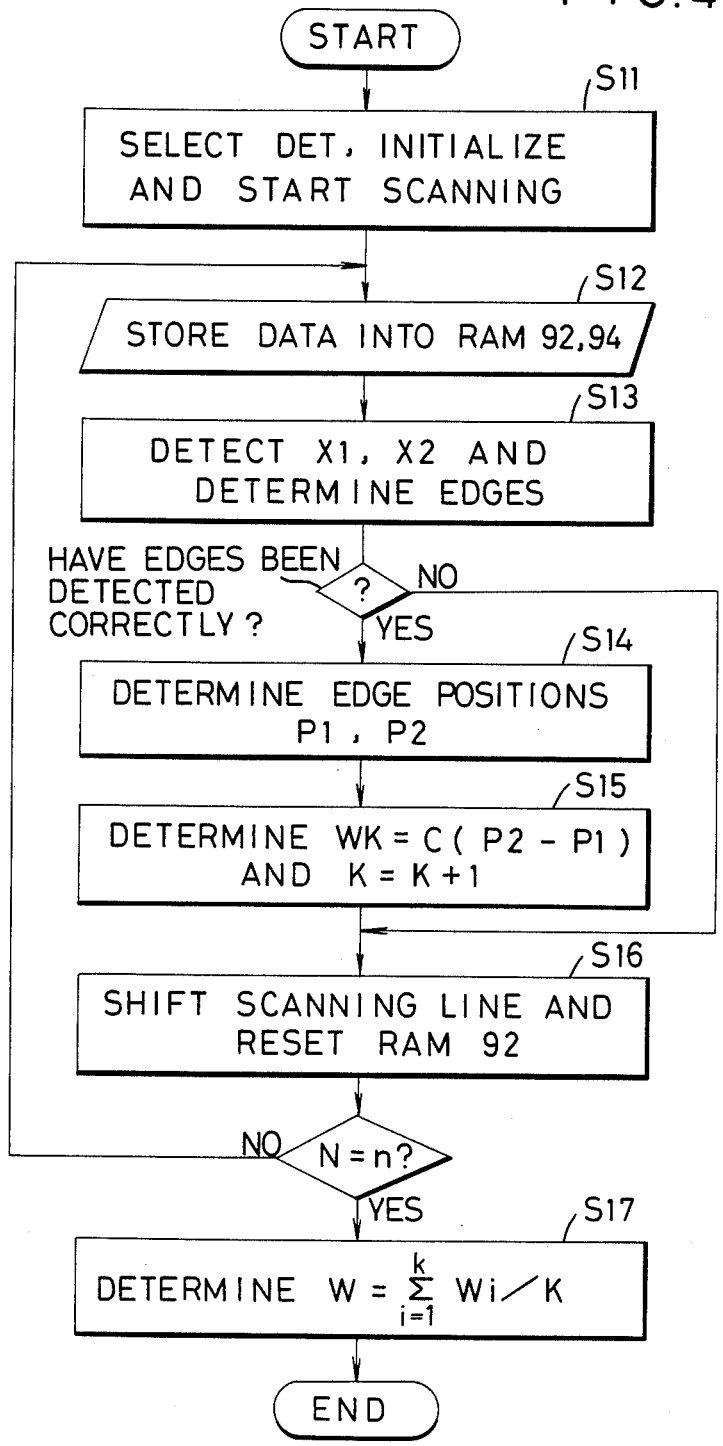
FIG. 4 is a flow chart showing an example of pattern detecting algorism.
Figure 5:
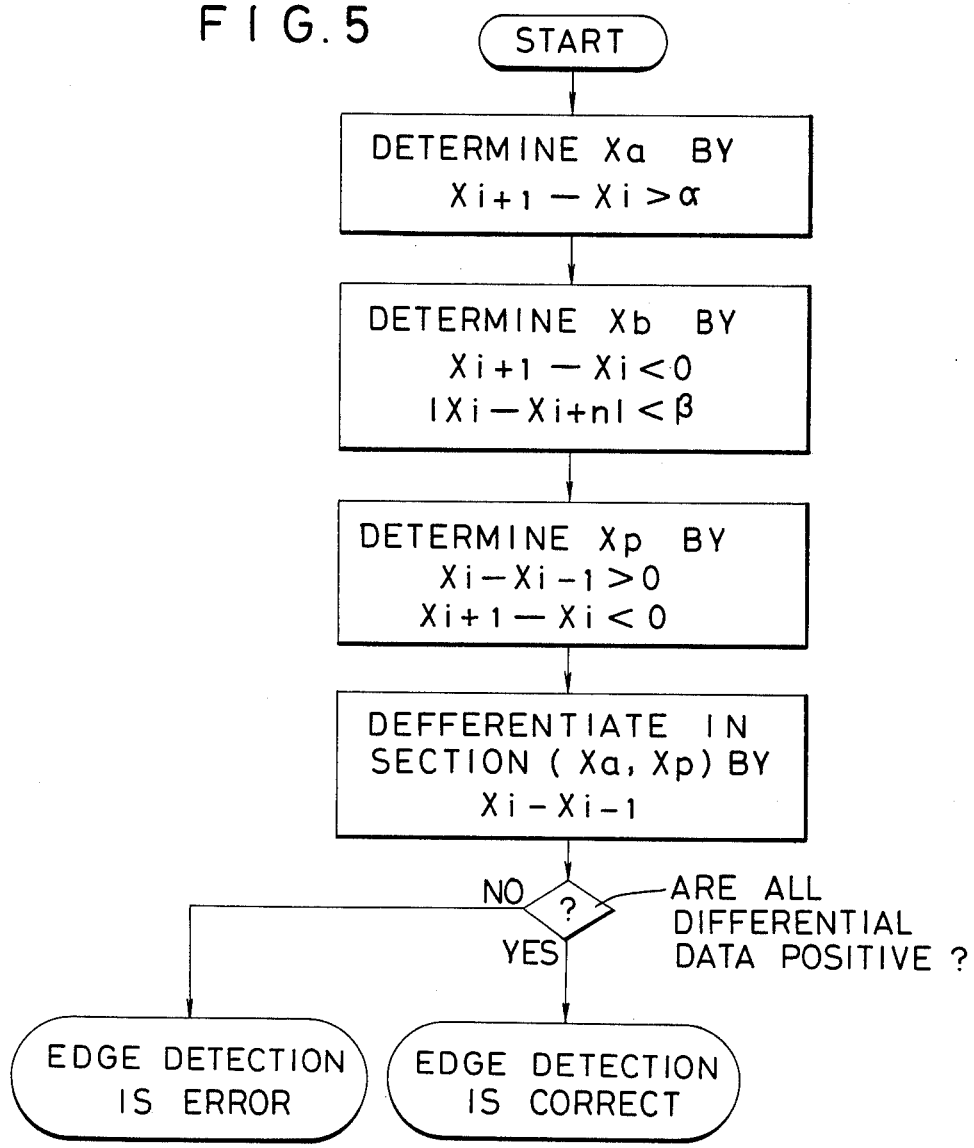
FIG. 5 is a flow chart showing an example of algorism for discriminating an error in edge detection.

FIGS. 3 to 6 are flow charts showing the function of the present embodiment, wherein FIG. 3 is a general flow chart of the entire measuring operation, FIG. 4 is a flow chart of the measuring algorism, FIG. 5 is a flow chart of an algorism for discriminating whether an edge measuring has been properly conducted, and FIG. 6 is a flow chart of an operation for preventing damage in photoresist. In the following these flow charts are referred to for explaining the function of the present embodiment.

At first referring to FIG. 3, when a measuring operation is started, the CPU 70 adjusts the position of the stage 34 in such a manner that a desired pattern on the wafer, for example a protruding linear wiring pattern, is positioned at the center of an observing field of the objective lens 32, and adjusts the rotational position of the image rotating prism 28 in such a manner that the scanning trajectory of the laser beam spot orthogonally crosses said linear pattern (step S1).

Then the shutter drive unit 105 is controlled through the slave CPU 104 to open the shutter 11 (step S2).

Subsequently the automatic focusing unit 69 is activated to focus the laser beam spot onto the wafer (step S3).

At this point there is conducted a check whether the serial measuring operation, including the automatic focusing, has been properly conducted (step S4).

If there is an error in said operation, the operation is immediately interrupted and an alarm is given. On the other hand, if the operation is identified normal, the flow proceeds to a step S5 in which the CPU 70 regulates the intensity of the laser beam according to the following procedure. At first fixed values are supplied to the dividers 74, 76 for gain control, thereby fixing the signal gains. Then a scanning operation with the laser beam spot is conducted only once, and the signals from the measured pattern are digitized and stored in the RAM's 92, 94. The signal level of said pattern is measured by monitoring said digital data. According to the result of measurement, the filter drive unit 106 is activated through the slave CPU 104, thereby controlling the transmittance of the filter 13. In this manner the intensity of the laser beam is adjusted to a level suitable for pattern metering.

Subsequently there is executed a pattern matering, as will be detailedly explained later.

Upon completion of the metering, the CPU 70 activates the shutter drive unit 105 through the slave CPU 104, thereby closing the shutter 11 and intercepting the laser beam (step S7).

The above-explained procedure is then repeated until all the required measurements are completed.

In the following there will be given an explanation on the pattern metering operation of the step S6, while making reference to FIG. 4.

In response to information for example on the material of the object to be detected, entered through an unrepresented keyboard, the CPU 70 supplies the multiplexer 72 with an instruction for selecting the combination of photoelectric signals, according to the form and material of the pattern to be measured. (step S11). For example if the pattern is composed of a metal such as aluminum, the metering is preferably conducted with the scattered light or the normal reflected light. Photoresist can be measured with any of the optical information, but the accuracy of metering can be significantly improved if the fluorecent light is employed in combination with the scattered light or regular reflected light. In the following, therefore, there will be explained a case of measuring the width of a linear photoresist pattern by means of the regular reflected light and the fluorescent light. Thus the CPU 70 so controls the multiplexer 72 as to supply the photoelectric signals of the photodetectors 50, 60 respectively to the dividers 74, 76. After the initialization such as the setting of a planned number n of scannings, resetting of the number N of scannings and resetting of the normal number K of measurements, the CPU 70 starts the pattern scanning with the laser beam spot.

Then the CPU 70 opens the gate 90, and activates the scanning unit 16 until the laser beam spot moves from a scanning start position to a position across the linear pattern. The flat glass plate 20 with parallel surfaces is maintained at a suitable position. In this manner wave form data as shown in FIG. 8 are stored in the RAM's 92, 94 (step S12).

Figure 9A:
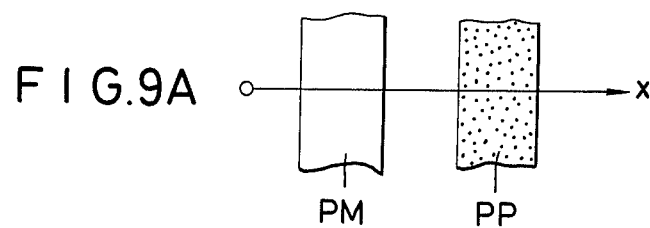
FIGS. 9A and 9B are a plan view and a cross-sectional view showing an example of pattern.
Figure 9B:
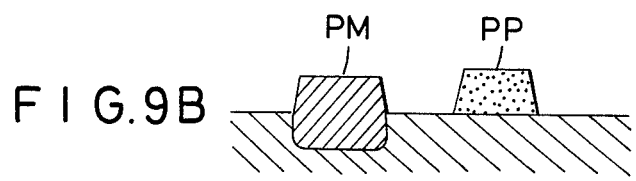

These data are obtained by scanning motion of the laser beam spot along a scanning line crossing, as shown in FIGS. 9A and 9B, a photoresist pattern PP and a polysilicon or metal pattern PM. In this case the fluorescent light is generated only by the organic photoresist layer, so that the linear pattern PP can be identified by a high-intensity portion of said wave form data. Thus the data of the regular reflected light stored in the RAM 92 exhibit peaks and bottoms corresponding to the edges of the patterns PM and PP. On the other hand, the fluorescent light data stored in the RAM 94 exhibit simple level changes corresponding only to the photoresist pattern PP.

In case of a photoresist pattern, it is important to measure the width close to the base or bottom of the pattern. Since the signal corresponding to the fluorescent light faithfully reflects the cross-sectional structure of the photoresist pattern PP, the end positions x1, x2 of said pattern PP can be accurately determined by selecting a slice level Vs slightly higher than the background noise of the signal but sufficiently lower than the maximum signal level.

Said positions x1, x2 can be determined from the difference between an address $AD_0$ of the RAM 94 corresponding to the scanning start position x0 and addresses $AD_1$, $AD_2$ respectively corresponding to the positions x1, x2, and from the unit amount of scanning, for example 0.01 μm. However, if the line width measurement based on the fluorescent light alone is enough, it is sufficient to calculate the product of the difference between the addresses $AD_2$ and $AD_1$ with the unit amount of scanning, without determining the positions x1 and x2.

Once the positions x1, x2 are determined, the CPU 70 selects a section $L_0$, corresponding to the positions x1, x2, in the data of the regular reflected light stored in the RAM 92, and determines the position of a step edge or the edge-to-edge distance (line width) of the pattern PP, from the wave form of said section $L_0$ or the vicinity thereof (step S13).

Now reference is made to FIG. 5, showing a procedure for discriminating whether the above-explained measuring procedure has been properly executed.

At first data stored in the RAM 92 are processed to determined an upshift start position $X_a$. For example the position $X_a$ is defined as a point $X_i$ satisfying a relation $X_{i+1} - X_i > \alpha$, wherein $\alpha$ is a sufficinetly large value.

Then an upshift end point $X_b$ is determined. For example the position $X_b$ is defined as a point $X_i$ satisfyin $X_{i+1} - X_i < 0$ and $|X_i - X_{i+n}| < \beta$, wherein n is equal to or larger than 5 and $\beta$ is a sufficiently small value.

Figure 10:
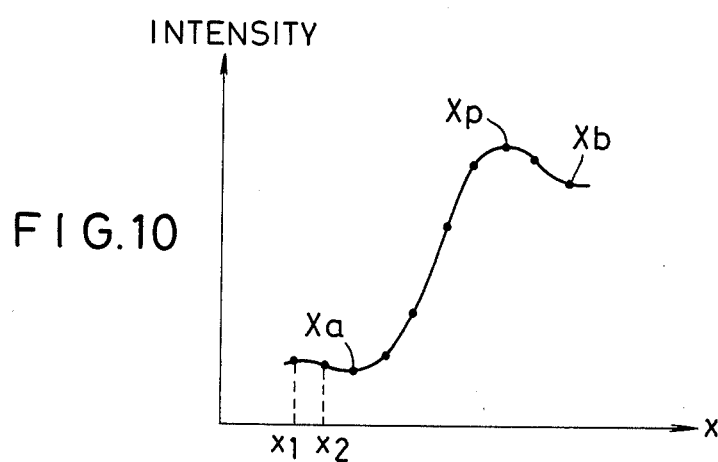
FIG. 10 is a chart showing the error detecting procedure.

Then determined is a peak point $X_p$ immediately before said point $X_b$. For example the point $X_p$ can be defined as a point $X_i$ satisfying conditions $X_i - X_{i-1} > 0$ and $X_{i+1} - X_i < 0$. FIG. 10 illustrates an example of $X_a$, $X_b$ and $X_p$.

Subsequently all the data in a process section $[X_a, X_b]$ are subjected to differentiation, by calculating $X_i - X$-

$i-1$, and the correctness of the edge detection is discriminated according to whether said differentiated data are all positive or not.

In the absence of influence of granulation, the signal of the reflected light assumes a form as shown in FIG. 11. Consequently the differentiated data become all positive, indicating the correctness of edge detection.

On the other hand, in the presence of influence of granulation, the reflected light signal may assume a form shown in FIG. 12, so that the differentiated data are not all positive, indicating an error in the edge detection.

If the reflected light signal is free from the influence of granulation, the edge detection is conducted correctly, and edge positions P1, P2 are calculated (FIG. 4, step S14). Then the pattern line width is determined according to an equation $Wk = C(P_2 - P_1)$ wherein C is a predetermined coefficient, and the number of scanning K involving correct edge detection is increased by one (step S15).

If the reflected light includes the influence of granulation, the edge detection is identified erroneous, and the steps S14 and S15 are skipped.

Then the CPU 70 activates the drive unit 22 to rotate the flat glass plate 20 by a predetermined amount, thereby shifting the laser beam spot, as shown in FIG. 13, in the scanning direction (X) and in the perpendicular direction (Y), and allowing the scanning operation at a different position (step S16). The RAM 92 is cleared and used for storing the data of regular reflected light in thus shifted scanning position.

The procedure of edge detection, calculation of pattern line width and shift of scanning position (steps S12 to S14) is then repeated n times. Upon completion of the scanning operations of n times, the line width is determined as the average value:

$$W = \sum_{i=1}^{k} Wi/K$$

wherein K is the number of correct measurements.

Now reference is made to FIG. 6 for explaining the operation of preventing damage in photoresist caused by the laser beam.

The slave CPU 104 constantly monitors whether the laser beam is positioned on a photoresist area through the detection of the reflected light or fluorescent light, and, upon detection that the laser beam is on the photoresist, sends an interruption signal to the CPU 70.

Thus the CPU, identifying that the laser beam is positioned on the photoresist, discriminates whether the pattern is being scanned in the X-direction by the laser beam spot (step S21). The scanning operation discriminated in this operation is the scanning for metering in the step S6, shown in FIG. 3, or the scanning for metering of signal level in the step S5.

If the scanning operation is in progress, the CPU 70 sends an instruction to the slave CPU 104 to activate the filter drive unit 106, thereby controlling the transmittance of the attenuating filter 13 (step S22). Said transmittance is selected at such a level that the photoresist is not damaged by the laser beam when it is in motion, though it is apt to be damaged if the laser beam remains at a same position.

Then the CPU 70 discriminates whether the laser beam spot scans a same position of the photoresist repeatedly in the X-direction (step S23). The use of such repeated scanning is determined according to whether the accuracy of measurement is to be improved through averaging of the results, or the throughput of measurement is to be increased, and is instructed to the CPU 70 in advance through the keyboard.

In case of repeated scannings, the CPU 70 discriminates whether the photoresist is significantly damaged by such repeated scanning, leading to a decrease in the line width (step S24). Said discrimination can be made by repeating the measurement of line width of the photoresist.

If the measured dimension shows a change, indicating that the photoresist is already damaged, the CPU 70 determines whether to change the position of measurement or to interrupt the measuring operation, based on the information entered in advance (step S25). In case of a pattern as shown in FIG. 13, it is effective to effect the scanning along different lines by a shift of the laser beam spot in the Y-direction, in order to average the fluctuation of results caused by the edges and to avoid the damaged portion. On the other hand, in the measurement of a circular pattern called contact hole, such shift in the Y-direction is not possible because the diameter of circle has to be measured.

In case the position of measurement is to be changed, there is made a shift in the Y-direction, and the measurement is continued by the scanning motion of the laser beam spot in the X-direction (step S26).

Then there is discriminated whether the number N of repeated measurements has reached a predetermined value n entered into the CPU 70 in advance (step S27).

If the step S24 identifies the absence of change in the line width, indicating that the photoresist is scarcely damaged, the flow jumps to the step S27.

Figure 6A:
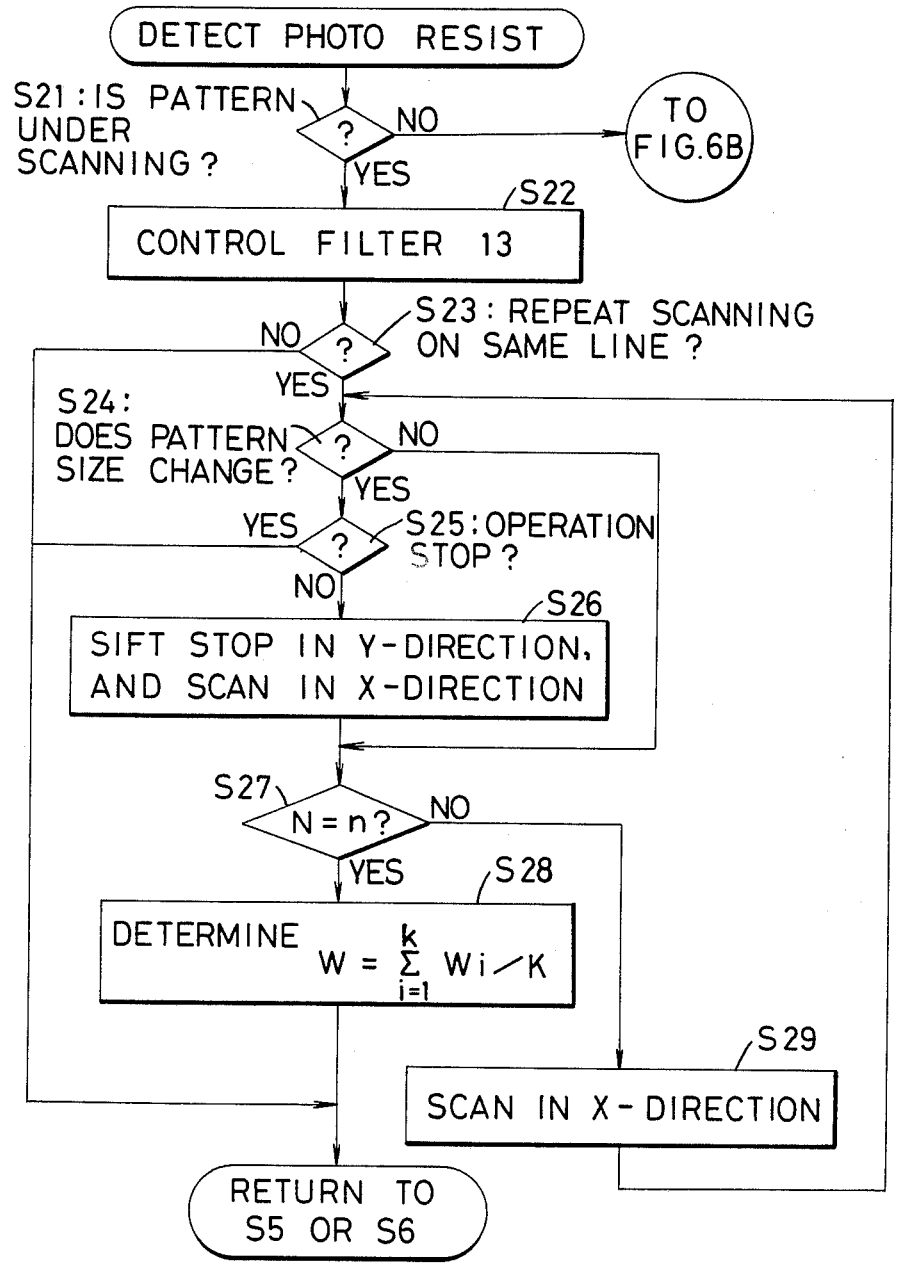

If the step S27 identifies that the number of repeated measurements has reached the predetermined value, the average line width is calculated in the same manner as in the step S17, shown in, FIG. 4, and the metering operation is terminated. If the above-explained procedure shown in FIG. 6A is executed in the course of the step S5 in FIG. 3, the flow returns to said step S5, or, if said procedure is executed in the course of the step S6, the flow returns to the pattern metering step S6.

On the other hand, if the step S27 identifies that the number of repeated measurements has not reached said predetermined value, the measurement is continued by the scanning motion of the laser beam spot in the X-direction (step S29), and the flow returns to the step S24.

In case the step S23 identifies that the scanning is not to be repeated or the step S25 identifies that the laser beam spot is not shifted in the Y-direction, the metering operation is terminated and the flow returns to the step S5 or S6.

If the laser beam spot is not in the scanning motion, the flow proceeds from the step S21 to a step S30, shown in FIG. 6B, for discriminating whether the focusing operation by the automatic focusing unit 69 is in progress.

If said focusing operation is not in progress, indicating that the laser beam spot is already focused onto the photoresist or is in a similar state, the photoresist is exposed to the spot of a high energy density and is likely to be damaged. In such state, therefore, the CPU 70 activates the shutter drive unit 105 through the slave CPU 104, thus closing the shutter 11 for the laser beam (step S31). Then the CPU 70 sets an error flag in an internal RAM and terminates the procedure (step S32), whereupon the flow returns to the step S3 and the step S4 then identifies an error.

On the other hand, in case the step S30 identifies that the automatic focusing operation is in progress, indicating the execution of the step S3 shown in FIG. 3, the CPU 70 interrupts said fucusing operation (step S33).

Then the CPU 70 causes the scanning motion of the laser beam spot in the X- or Y-direction, then causes the slave CPU 104 to discriminate whether the laser beam spot is positioned on a photoresist area, and stops the laser beam spot at a position which is identified as not photoresist by the slave CPU 104. The identification of a non-photoresist position may also be made by the CPU 70 itself, through monitoring of the output of the reflected light detector 50 or of the fluorescent light detector 60. In this manner it is rendered possible to prevent the damage in photoresist by the irradiation with the beam spot in the course of focusing operation.

If a non-photoresist position is found in the foregoing procedure, the flow returns to the step S3, shown in FIG. 3, to re-start the automatic focusing operation.

On the other hand, if such non-photoresist position cannot be found within the scanning range of the laser beam spot, the flow jumps to the step S31 to insert the shutter 11 into the laser beam. Then the step S32 sets an error flag. The flow returns to the step S3, shown in FIG. 3, and the step S4 identifies the error.

Figure 14:
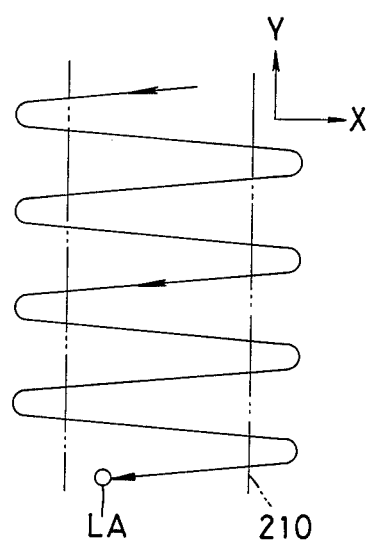
FIG. 14 is a schematic view showing the scanning trajectory of a laser beam spot.

In the first embodiment explained above, the laser beam spot on the wafer follows a trajectory as shown in FIG. 14, by the motion of the scanning unit 16 and the flat glass plate 20. Since said trajectory is formed by oscillating motions, the staying time of the laser beam spot LA at a point is longer in the folded portions of trajectory where the scanning direction is reversed, than in the linear portions of trajectory, so that the energy density of irradiation by the laser beam spot is larger in such folded or reversing portions than in the linear portions.

If such reversing portions are present on a photoresist layer, the photoresist may be deteriorated by the irradiation of the laser beam.

On the other hand, though it is effective, for the purpose of improving the accuracy of detection, to select the scanning length in the X-direction sufficiently larger than the pattern width, thereby improving the uniformity of scanning speed in the linear scanning portions, such method will inevitably require the reversing portions to be placed at positions relatively distant from the pattern, thus eventually resulting in the danger of unnecessarily damaging the wafer.

A second embodiment, to be explained in the following, is intended to prevent the destruction or deterioration of the photoresist layer, by effectively protecting the areas unnecessary for measurement, from the irradiation with the laser beam spot.

Figure 15:
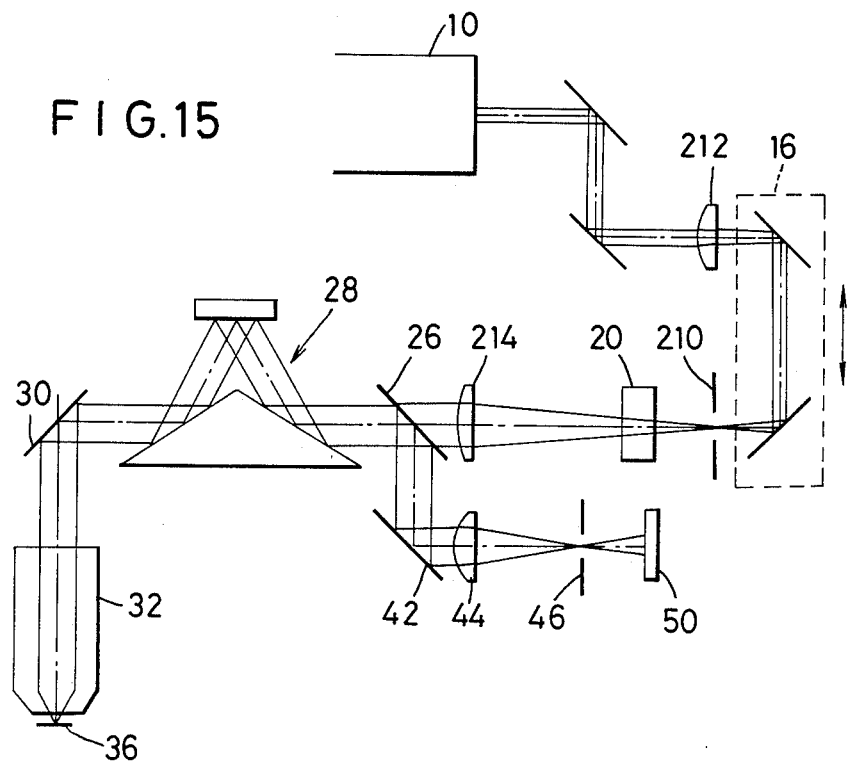
FIG. 15 is a schematic view of optical systems of a second embodiment of the present invention.

Now reference is made to FIG. 15, in which substantially same components as those in FIG. 1 are represented by same numbers. In addition to the structure shown in FIG. 1, a slit 210, for limiting the scanning range of the laser beam spot, is provided between the scanning unit 16 and the flat glass plate 20. The slit 210 is positioned conjugate with the surface of the wafer 36, with respect to the objective lens 32 and a lens 214.

Figure 16:
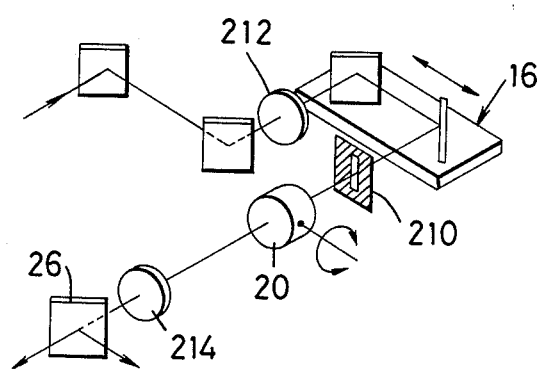
FIG. 16 is a perspective view of a principal portion of the embodiment shown in FIG. 15.

As shown in FIG. 16, the slit 210 extends in a direction perpendicular to the moving direction of the scanning unit 16. Also FIG. 14 illustrates the relation of the slit 210, in chain lines, to the trajectory of the laser beam spot on the wafer.

As will be apparent from these drawings, in the scanning motion of the laser beam spot in the X-direction caused by the reciprocating motion of the scanning unit 16, the optical path corresponding to the reversing portions is intercepted by the slit 210, so that the laser beam reaches the wafer only in the linear portions.

The width of the slit 210 can be easily made variable, and in this manner the irradiating range can be selected at an optimum value according to the line width of the pattern.

Also said slit 210 may be utilized as a reference for detecting the position of the laser beam spot. For example it is possible to know the position of the laser beam spot with respect to the apparatus, by detecting the crossing position of the beam spot on the edge of the slit, through a change in the output signal for example of the detector 50.

In the above-explained embodiment, the slit may be so constructed as to completely intercept the laser beam in the reversing portions of the scanning trajectory, or to attenuate said beam, in said reversing portions, to a level not harmful to the photoresist.

In the foregoing embodiments, the scanning unit 16 is provided with a drive unit composed of a driving motor and a screw gear, for causing a reciprocating motion of the paired mirrors in the illustrated direction, for example several cycles over a distance of about 1 mm, thereby causing a parallel shift of the optical axis of the emerging laser beam.

However a high-speed reciprocating motion, if adopted for improving the throughput, may induce the vibration of the entire apparatus at the start of the scanning operation and at the reversing of the scanning direction.

For moving the scanning unit at a higher speed, a larger acceleration has to be obtained by applying a larger force to the scanning unit, and such increased force may induce a vibration in other parts than the scanning unit, hindering exact pattern measurement.

Figure 17:
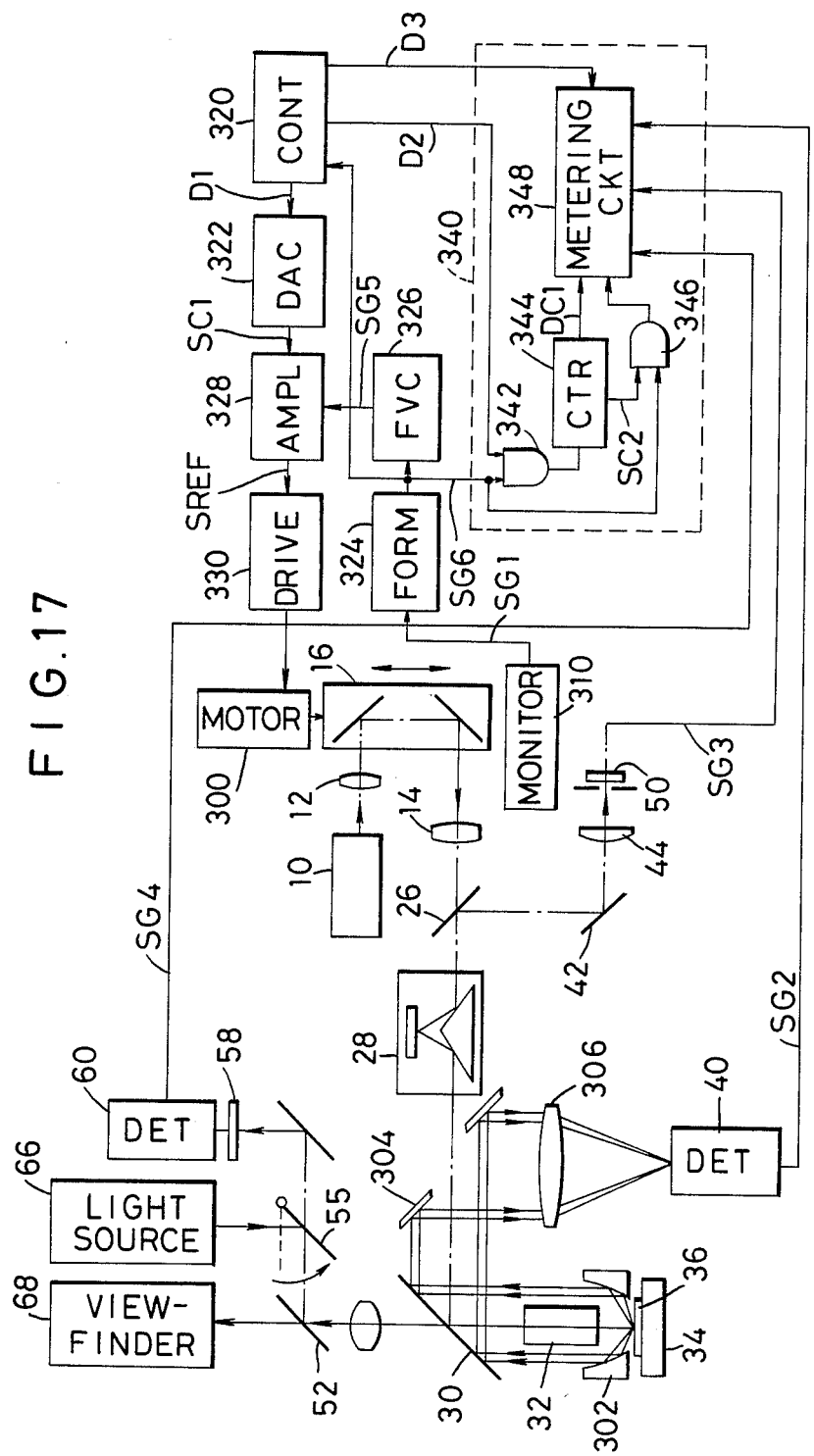
FIG. 17 is a block diagram of a third embodiment of the present invention.

This difficulty can however be overcome by a third embodiment shown in FIG. 17, in which substantially same components as those in FIG. 1 are represented by same numbers. For driving the scanning unit 16 there is provided a voice coil motor 300 in which an armature moves linearly with respect to a stator and is directly connected to the scanning unit 16.

The output signal SG1 of an interferometer provided in a monitor 310 represents the moving distance of the scanning unit 16.

The detector 40 detects the scattered light, collected by a spherical annular mirror 302 provided around the objective lens 32, a dichroic mirror 30, a doughnut mirror 304 and a lens 306, and generates a detection signal SG2.

The detector 50 receives the regular reflected light and generates a detection signal SG3.

The detector 60 receives the fluorescent light and generates a detection signal SG4.

A control circuit 320, composed of a microcomputer, releases control information D1, in response to which a D/A converter 322 releases a control signal SC1 for controlling the scanning unit 300.

The output signal SG1 from the interferometer 310 is transmitted, through a wave forming circuit 324, to the control circuit 320 and a frequency-voltage converting circuit 326.

A detection signal SG5, released from the frequency-voltage converter 326 and having a signal level proportional to the moving speed of the scanning unit 16, is transmitted to an error amplifier 328 together with the control signal SC1, and the driving circuit 330 drives the voice coil motor in response to an error signal $S_{REF}$ released from said error amplifier 328.

When a gate 342 is opened in response to control informatioh D2 released from the control circuit 320, a metering unit 340 sends a detection signal SG6 of the interferometer 310 released from the wave forming circuit 324 to a counter 344, and measures the amount of movement of the scanning unit by counting the number of pulses of the detection signal SG6, of which logic level is inverted for every movement of a predetermined distance.

When said count reaches a predetermined value, the counter 344 sends a control signal SC2 to a gate 346 thereby supplying the detection signal SG6 to a metering circuit 348 through said gate 346, and also sends said count in succession as the count information DC1 to said metering circuit 348.

In response to control information D3 released from the control circuit 320 and in synchronization with the detection signal SG6 supplied through the gate 346, the metering circuit 348 fetches the detection signals SG2, SG3 and SG4 obtained from the detectors 40, 50 and 60 together with the counter information DC1, thereby measuring the intensity of the reflected, scattered and fluorescent lights at a regular interval, for example every 0.01 μm, in the course of the movement of the scanning unit.

Figure 18:
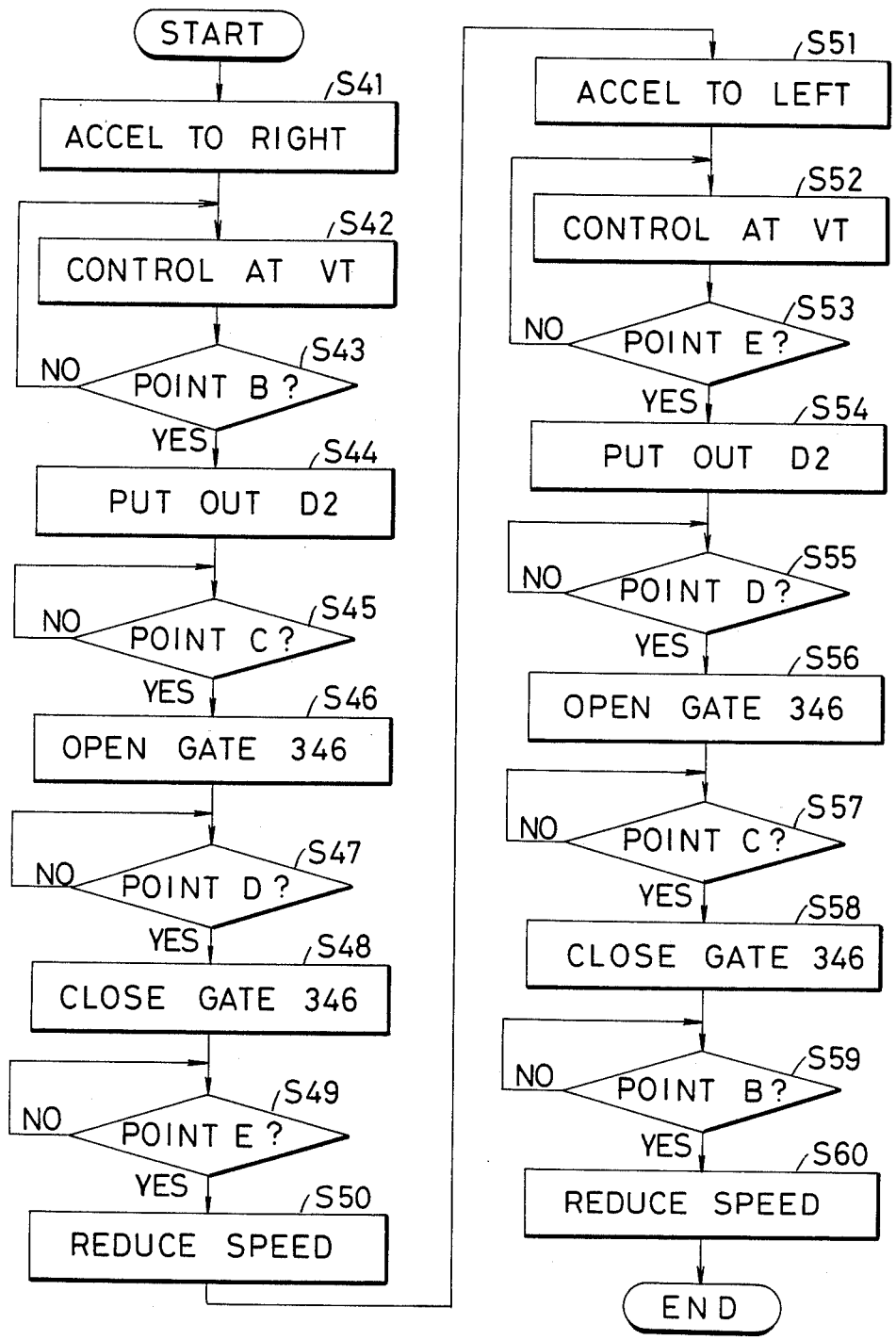
FIG. 18 is a flow chart showing the function thereof.
Figure 19:
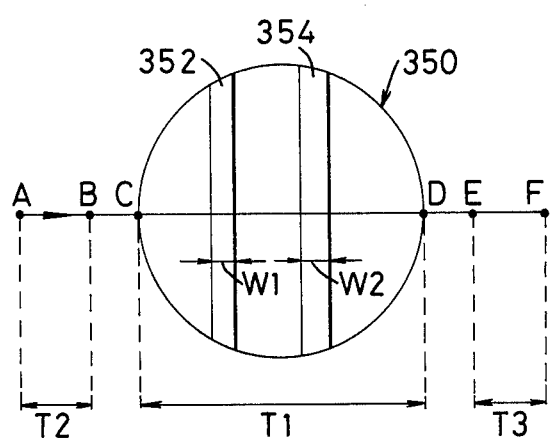
FIG. 19 is a plan view showing the scanning operation with a laser beam spot therein.

In addition the control circuit 320 and the metering unit 340 execute a procedure shown in FIG. 18 for measuring the widths W1, W2 of patterns 352, 354 on the semiconductor wafer 36, as shown in FIG. 19, positioned in a circular viewing field 350 of a diameter T1, for example 30 μm, of a finder 68.

More specifically, in a step S41, a control signal D1 is released to start a scanning motion of the laser beam spot, originally positioned at A at the left-hand side of the viewing field 350, toward right, and said spot is gradually accelerated to a predetermined speed in a step S42.

Figure 20:
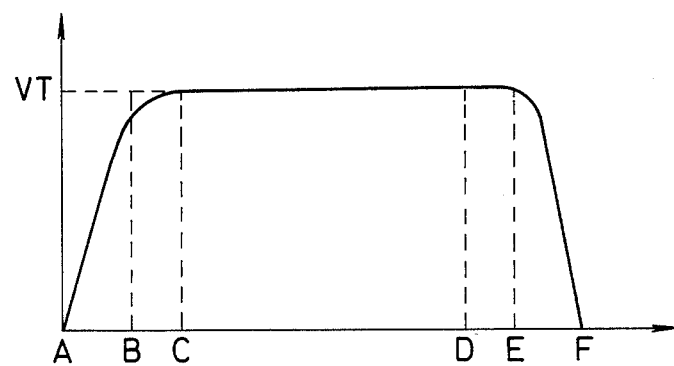
FIG. 20 is a chart showing the moving speed of a scanning unit.

Therefore, as shown in FIG. 20, the scanning unit 16 is gradually accelerated to the predetermined speed $V_T$ by the driving force from the voice coil motor, so that the vibration of the entire apparatus at the start and acceleration of the movement can be alleviated.

Then, in a step S43, the control circuit 320 discriminates whether the laser beam spot has reached a point B by a movement of T2 from the point A, based on the detection signal SG6 of the interferometer 310 obtained from the wafe forming circuit 324, and, if not, returns to the step S42 for accelerating the scanning unit 16 to the predetermined speed.

The distance T2 is so selected as to correspond to the acceleration of the voice coil motor to the predetermined speed, and in practice can be selected in the order of 5 μm.

When the laser beam spot passes the point B, the step S43 provides an affirmative discrimination whereby the control circuit 320 proceeds to a step S44 to terminate the acceleration of the voice coil motor but to drive said motor at a constant speed. At the same time it opens the gate 342 by releasing a control signal D2, thereby supplying the detection signal SG6 to the counter 344.

Thus the counter 344 starts to count the number of the pulses of the detection signal SG6, and, when said count reaches a predetermined value in a step S45, the flow proceeds to a step S46 to release a control signal SC2 thereby opening the gate 346.

In this state the laser beam spot is positioned at a point C approximately at the left-hand end of the viewing field 350, and the metering circuit 348 does not measure the pattern present in the viewing field 350 until the acceleration of the voice coil motor is terminated and the scanning unit 16 reaches a constant speed so that the vibration of the apparatus is attenuated to a practically acceptable level. After the start of counting operation of the detection signal SG6 by the counter 344 in response to the control signal D2 released from the control circuit 320, the control signal SC2 of said counter 344 is used for opening the gate 346 thereby initiating the measuring operation. In this manner it is rendered possible to prevent the delay which is encountered in case the measurement is started by the program execution of the control circuit 320.

Then, when the count of the detection signal SG6 by the counter 344 reaches the predetermined value in a step S47, indicating that the laser beam spot has passed a point D, the flow proceeds to a step S48 for releasing the control signal SC2, thereby closing the gate 346.

In this manner, during the scanning motion of the laser beam spot at a constant speed over a range T1 from the point C to D in the viewing field 350, the metering circuit 348 measures the pattern widths W1, W2 based on the detection signals SG2, SG3 and SG4 respectively obtained from the detectors 40, 50 and 60, in synchronization with the pulses of the detection signal SG6 from the interferometer 310.

Subsequently the control circuit 320 proceeds to a step S49 for discriminating whether the laser beam spot has passed a point E outside the right-hand end of the viewing field. When the spot has passed said point E, the flow proceeds to a step S50 to gradually decelerate the voice coil motor so as not to generate significant vibration in the apparatus. The scanning motion of the laser beam spot is terminated at a point F distant from the point E by a distance T2, for example 5 μm, and the program proceeds to a step S51 to start the scanning motion of the laser beam spot toward left.

In the same manner as in the scanning motion toward right executed in the steps S41 to S50, the control signal D1 is at first released to start acceleration, and the speed is gradually increased to a predetermined value. When the laser beam spot passes the point E, the control signal D2 is released to open the gate 342, whereby the counter 344 starts the counting of the pulses of the detection signal SG6.

When the laser beam spot passes the point D, the gate 346 is opened to execute the measuring operation, and, when the laser beam spot passes the point C, the gate 346 is closed to terminate the measuring operation.

Subsequently, when the laser beam spot passes the point B, the voice coil motor starts to be decelerated, whereby the laser beam spot is stoped at the point A.

What is claimed is:

1. An apparatus for detecting the position of a particulate material present on a surface, comprising:
   means for radiating an energy beam to form a tiny spot of said energy beam on said surface;
   means for scanning said surface with tiny spot along a scanning line, by relative movement of said surface and said energy beam;
   means for generating a first output representing the position of an edge of said particulate material crossing said scanning line, by receiving a first optical energy generated at a local portion of said surface at which said tiny spot is formed;

means for generating a second output representing that said tiny spot is positioned on said particulate material, by receiving a second optical energy generated at a local portion of said surface at which said tiny spot is formed; and means for controlling said energy beam radiating means in response to said second output, thereby preventing the damage in said particulate material caused by said energy beam.

2. An apparatus according to claim 1, wherein said first optical energy and said second optical energy are generated in response to said energy beam.

3. An apparatus according to claim 1, wherein said first optical energy is at least either one of the reflected one or the scattered one of said energy beam.

4. An apparatus according to claim 1, wherein said second optical energy is luminescent light generated by said surface in response to said energy beam.

5. An apparatus according to claim 1, wherein said energy beam radiating means comprises focusing means to be adjusted for converging said energy beam onto said surface, and means for activating said focusing means while said scanning means is disabled, and wherein said control means is adapted to enable the operation of said focusing means by said activating means on the condition that said second output is not generated.

6. An apparatus according to claim 1, wherein said energy beam radiating means comprises means for varying the energy density of said tiny spot on said surface, and said control means is adapted to reduce the energy density in said tiny spot by controlling said varying means.

7. An apparatus according to claim 1, wherein said relative movement means is adapted to cause a relative vibration of said surface and said energy beam thereby scanning surface in reciprocating manner with said tiny spot, and said apparatus further comprises means for limiting the arrival of said energy beam at said surface, in each inverting period in which the scanning direction of said tiny spot is inverted on said scanning line.

8. An apparatus according to claim 6, wherein said energy density varying means comprises attenuating filter means.

9. An apparatus according to claim 7, wherein said limiting means is adapted to limit the arrival of said energy beam at said surface, except for a predetermined period between the inversion of the scanning direction of said tiny spot on said scanning line and a next inversion.

10. An apparatus according to claim 7, wherein said vibrating means comprises means for shifting the path of said energy beam in reciprocating manner with respect to said surface, and said limiting means comprises a limiting member positioned in said reciprocatingly displaced path to partially inhibit the passing of said energy beam.

11. An apparatus according to claim 10, wherein said limiting member is provided with an aperture of a width smaller than the width of reciprocating displacement of said energy beam on said limiting member.

12. An apparatus according to claim 10, wherein said limiting member is placed at a position optically equivalent to said surface.

* * * * *